(12) United States Patent
Yunker et al.

(10) Patent No.: US 8,941,388 B2
(45) Date of Patent: Jan. 27, 2015

(54) AUTO-CALIBRATING PROXIMITY SENSOR FOR RETAIL DISPLAY SECURITY SYSTEM

(75) Inventors: Geoff Yunker, Vero Beach, FL (US); Walter V. Raczynski, V, Arlington Heights, IL (US); Charles L. Zimnicki, Lake Zurich, IL (US)

(73) Assignees: Tracthat LLC, Milwaukee, WI (US); Walter V. Raczynski, Milwaukee, WI (US); Charles L. Zimnicki, Milwaukee, WI (US)

( * ) Notice: Subject to any disclaimer, the term of this patent is extended or adjusted under 35 U.S.C. 154(b) by 254 days.

(21) Appl. No.: 13/584,233

(22) Filed: Aug. 13, 2012

(65) Prior Publication Data

US 2013/0063156 A1    Mar. 14, 2013

Related U.S. Application Data

(60) Provisional application No. 61/523,297, filed on Aug. 13, 2011.

(51) Int. Cl.
*G01R 35/00* (2006.01)
*H03K 17/96* (2006.01)

(52) U.S. Cl.
CPC .. *H03K 17/962* (2013.01); *H03K 2217/960755* (2013.01)
USPC ............................ 324/601; 324/110; 324/457

(58) Field of Classification Search
CPC ...... G01R 22/066; G01R 11/24; G01R 11/25; G01R 35/00; G08B 13/1418; H03K 17/962
USPC .......................................... 324/601, 110, 457
See application file for complete search history.

(56) References Cited

U.S. PATENT DOCUMENTS

| | | | |
|---|---|---|---|
| 7,522,047 B2 | 4/2009 | Belden, Jr. et al. | |
| 7,710,266 B2 | 5/2010 | Belden, Jr. et al. | |
| 2008/0169923 A1* | 7/2008 | Belden et al. | 340/568.3 |
| 2011/0316355 A1* | 12/2011 | Gruber et al. | 307/326 |

* cited by examiner

*Primary Examiner* — Son Le
(74) *Attorney, Agent, or Firm* — Brian G. Gilpin; Godfrey & Kahn, S.C.

(57) ABSTRACT

An auto-calibrated proximity sensor used with a protected item in a retail display security system includes a metalized surface that cooperatively interacts with a printed circuit board to form a capacitive cell. A microcontroller senses changes in the frequency of the capacitive circuit if the orientation of the metalized surface changes with respect to the printed circuit board.

1 Claim, 3 Drawing Sheets

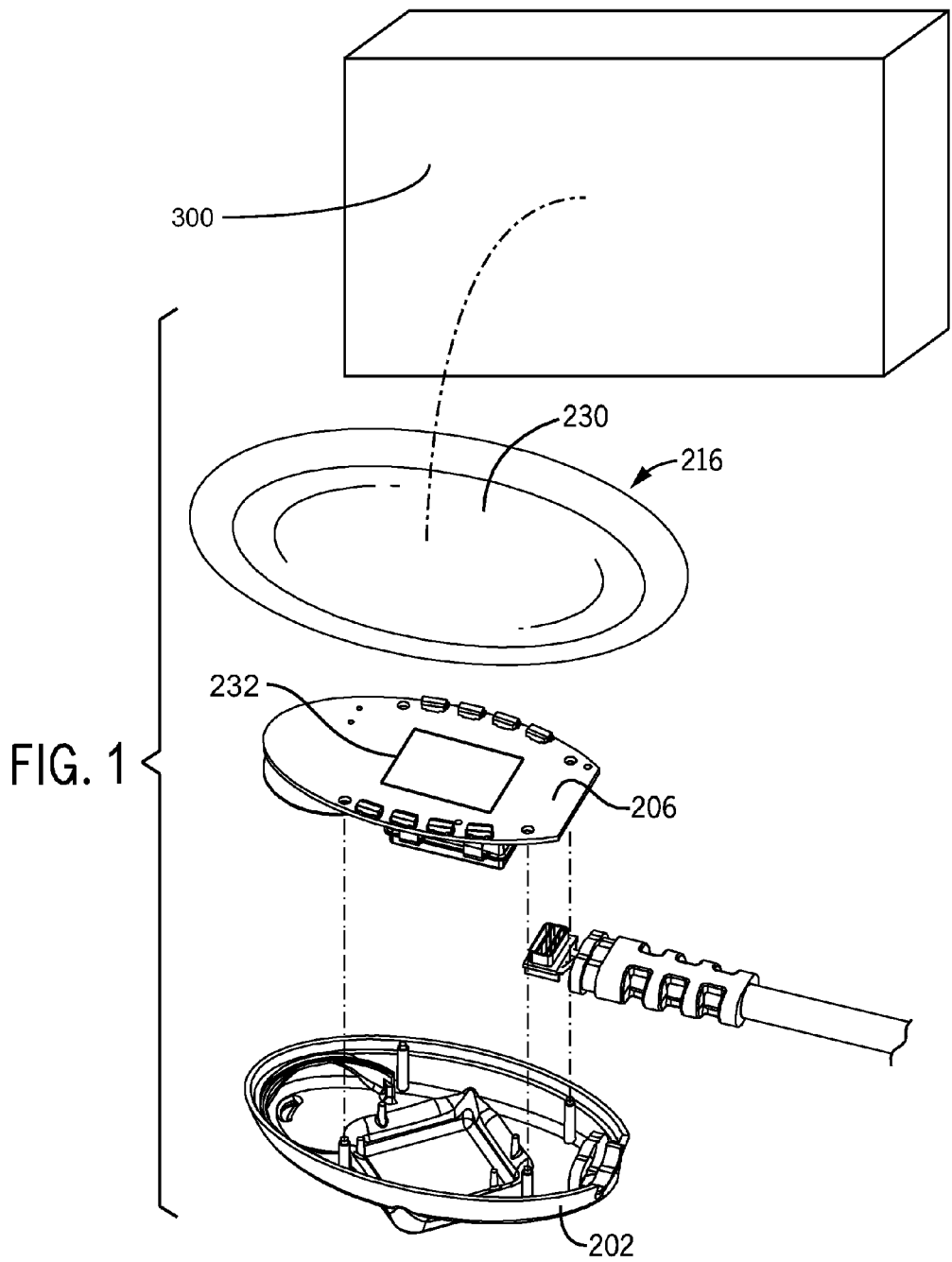

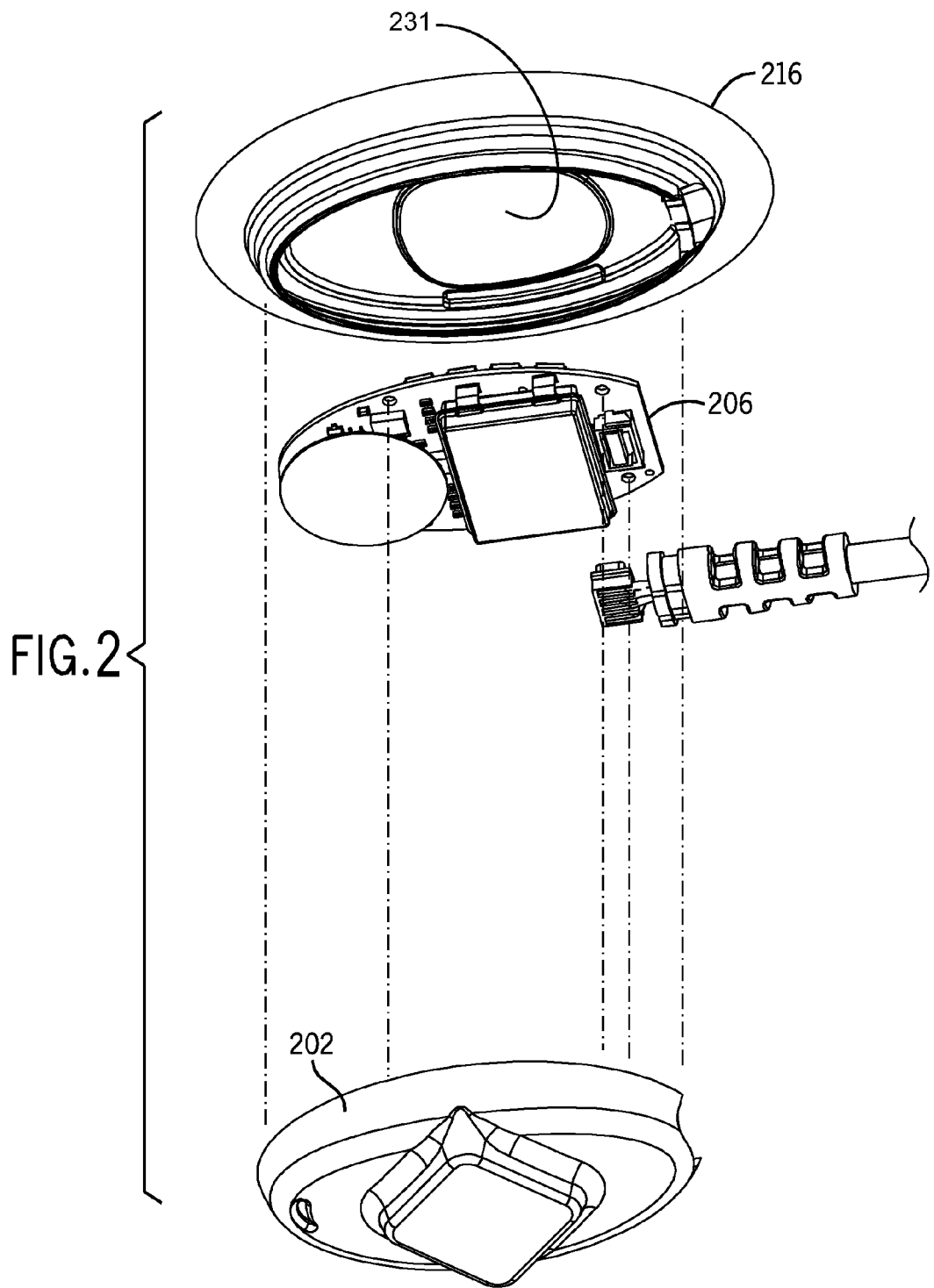

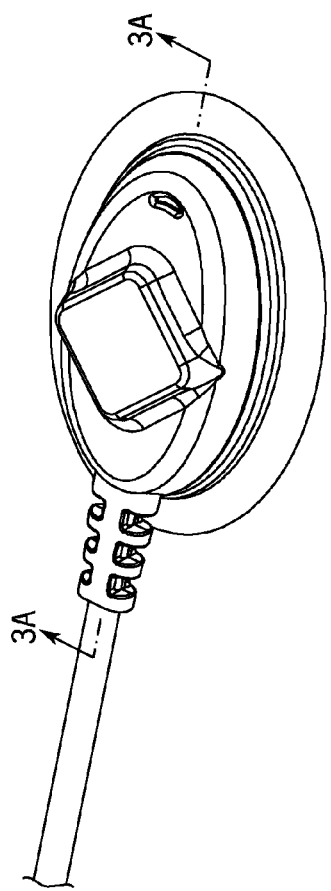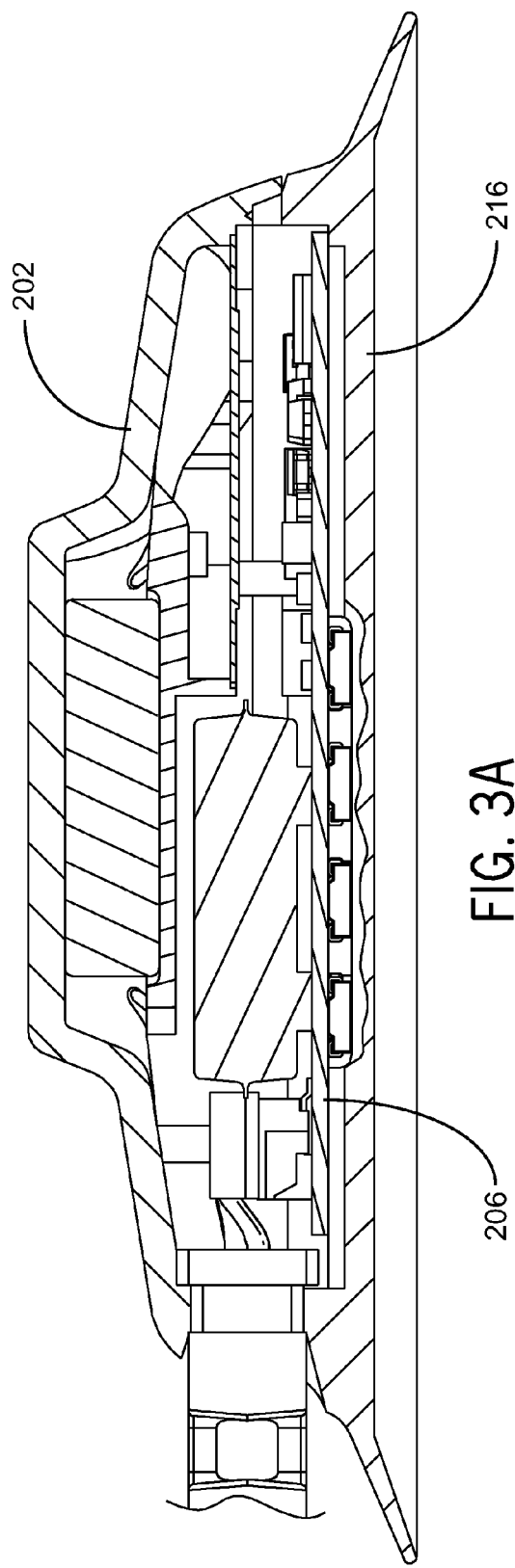

AUTO-CALIBRATING PROXIMITY SENSOR FOR RETAIL DISPLAY SECURITY SYSTEM

CROSS-REFERENCE TO RELATED APPLICATION

This application is based on and claims priority to U.S. Provisional Patent Application No. 61/523,297 filed on Aug. 13, 2011, which is incorporated herein by reference in its entirety for all purposes.

FIELD OF THE INVENTION

The present invention relates generally to the field of proximity sensors. More particularly, the present invention relates to an auto-calibrating proximity sensor used in a retail display security system.

BACKGROUND

In the field of retail displays, there is a need to display small items, typically electronics such as cell-phones, camcorders, cameras, and computers in a way that allows consumers to manipulate the devices in the store. A security problem exists, however, because the devices are typically small and valuable, making them ideal targets for theft. One common solution to the aforementioned security problem is to anchor the device to a shelf, table, or display. Such displays typically include mechanical attachments or adhesive attachments to secure the protected device to the display surface. The displays often include a head unit that attaches to the protected device, and a base unit onto which the head unit rests when the protected device is not being held by a customer. Additionally, the displays are often configured to align the protected device in a particular orientation when the head unit is replaced on the base unit. Existing displays also may provide power to the protected device and/or alarm capabilities in the event the device is removed from the display. Existing displays use a plunger sensor such as the one disclosed in U.S. Pat. No. 7,710,266, or an optical sensor to sense when the protected device is attached to the head unit. Sensors of those types are susceptible to false alarms due to temperature, humidity, or other environmental changes.

The existing displays cannot sense whether the protected device is being tampered with. In particular, the existing displays cannot determine whether the attachment of the head unit to the protected device has been altered after the initial attachment, unless the protected device is completely removed from the head unit.

SUMMARY

The present invention relates to an auto-calibrated proximity sensor used in a retail display security system. The auto-calibrated proximity sensor can include a housing, a printed circuit board, and a mounting surface or skirt enclosing the housing. The skirt can include a resilient outer flange, and further include a metalized inner surface that cooperatively interacts with the a printed circuit board to form a proximity sensor that senses when the attachment between the skirt and a protected surface is tampered with or altered in shape in any way. The proximity sensor can further include an automatically calibrated capacitive cell once power is applied that measures the curvature of the protected device to calibrate the final resting shape of the mounting surface or skirt.

It will be understood by those skilled in the art that one or more aspects of this invention can meet certain objectives, while one or more other aspects can lead to certain other objectives. Other objects, features, benefits and advantages of the present invention will be apparent in this summary and descriptions of the disclosed embodiment, and will be readily apparent to those skilled in the art. Such objects, features, benefits and advantages will be apparent from the above as taken in conjunction with the accompanying figures and all reasonable inferences to be drawn therefrom.

BRIEF DESCRIPTION OF THE DRAWINGS

FIG. 1 is an exploded perspective view of an auto-calibrating proximity sensor in accordance with the invention;

FIG. 2 is another exploded perspective view of the auto-calibrating proximity sensor of FIG. 1;

FIG. 3 is a perspective view of the auto-calibrating proximity sensor of FIG. 1; and FIG. 3A is a section view of the auto-calibrating proximity sensor of FIG. 1 taken generally along the line 3A-3A in FIG. 3.

DETAILED DESCRIPTION

Referring to FIGS. 1-3A, one embodiment of a retail display security system in accordance with the invention is shown. In the embodiment shown, the retail display security system includes a housing 202, a printed circuit board (PCB) 206, a microcontroller, and a cover 216. In the embodiment shown, the retail display security system is powered by an external power supply, but may also be powered by a battery within the cover 216 or other power source without departing from the invention.

In the embodiment shown, the housing 202 encloses the PCB 206. The microcontroller is attached to the PCB. The cover 216 encloses the housing 202. The inner portion of the cover 216 has a metalized interior surface 231. High bond adhesive is applied to the exterior surface 230 of the cover 216 so that when the housing 202 is attached to a surface 300 of a protected item, the housing 202 is permanently bonded to the surface 300 of the item. The housing 202 may be adhered to the surface by any other suitable means including but not limited to double sided tape or mechanical fasteners.

The metalized inner surface 231 cooperatively interacts with a circuit element 232 on the PCB 206 to form a capacitive cell. The capacitive cell detects attempts to remove the housing 202 from the surface. The interaction between the metalized inner surface 231 and the circuit element 232 forms the auto-calibrated capacitive cell structure. When the housing 202 is adhered to the surface, the metalized inner surface 231 automatically calibrates the capacitive cell structure by settling on a particular frequency. If someone attempts to tamper with the housing 202 or otherwise remove it from the surface, the necessary flexing or altering of shape of the cover 216 will change the frequency of the circuit and the microcontroller will detect the change. When such a change occurs, the microcontroller can activate an audio or visual alarm or take other desired action.

Although the invention has been herein described in what is perceived to be the most practical and preferred embodiments, it is to be understood that the invention is not intended to be limited to the specific embodiments set forth above. Rather, it is recognized that modifications may be made by one of skill in the art of the invention without departing from the spirit or intent of the invention and, therefore, the invention is to be taken as including all reasonable equivalents to the subject matter of the appended claims and the description of the invention herein.

What is claimed is:

1. A retail display security system adapted to be attached to a protected item, the system comprising:
   a housing;
   at least one printed circuit board mounted within the housing and including a microcontroller;
   and a cover enclosing the housing and adapted to be attached to the protected item; the cover including a metalized inner surface that cooperatively interacts with the at least one printed circuit board to form an auto calibrating capacitive cell circuit that senses when attachment between the cover and the protected item is tampered with by settling on a particular frequency so that if someone attempts to tamper with the cover or otherwise remove it from the protected item, the necessary flexing or altering of shape of the cover will change the frequency of the circuit and the microcontroller will detect the change.

* * * * *